United States Patent [19]

Dutta Roy

[11] 4,242,651
[45] Dec. 30, 1980

[54] WIDEBAND TRANSFORMER APPARATUS

[75] Inventor: Subash C. Dutta Roy, Ames, Iowa

[73] Assignee: Iowa State University Research Foundation, Inc., Ames, Iowa

[21] Appl. No.: 47,295

[22] Filed: Jun. 11, 1979

[51] Int. Cl.³ .......................... H03H 7/38; H01P 5/08
[52] U.S. Cl. ........................................... 333/32; 333/33
[58] Field of Search ................................... 333/32, 33

[56] References Cited

U.S. PATENT DOCUMENTS

| | | |
|---|---|---|
| 3,037,173 | 5/1962 | Ruthroff . |
| 3,037,175 | 5/1962 | Ruthroff ............................. 333/32 |
| 3,244,998 | 4/1966 | Broadhead, Jr. ................. 333/32 X |
| 3,882,432 | 5/1975 | Bowman et al. ...................... 333/32 |

FOREIGN PATENT DOCUMENTS

601765  4/1978  U.S.S.R. ................................... 333/33

OTHER PUBLICATIONS

Krauss et al., *Designing Toroidal Transformers, etc.*, Electronics, Aug. 16, 1973, pp 113–116.
Ruthroff, *Some Broad-Band Transformers*, Proc. of IRE, Aug. 1959, pp. 1337–1342.
Collin, *Foundations for Microwave Engineering*, McGraw-Hill, N.Y., 1966, pp. 221–237.
Tanaka, *Improving the Transmission Characteristics of Coaxial 1:–1 Transformers*, Electronics & Communications in Japan, vol. 58-c, Nov. 1, 1975, pp. 106–114.

*Primary Examiner*—Paul L. Gensler
*Attorney, Agent, or Firm*—James F. Hollander

[57] ABSTRACT

A first circuit having resistive impedance $R_2$ is to be electrically matched to a second circuit having resistive impedance $R_1$ being at least twice as great as $R_2$. To match them a transmission line transformer is provided with at least one partially reflecting characteristic impedance discontinuity. For instance, two cascaded sections of equal propagation delay length with characteristic impedances $Z_1$ and $Z_2$ are able to be employed. Then the input end of the $Z_1$ transmission line is connected across the first circuit. The $Z_2$ line has output conductors connected in series with the second circuit across the first circuit. Each line is advantageously wound in the form of a coil around its respective toroidal core. Energy from one of the two circuits acting as a generator passes into each end of the line and is reflected and transmitted at the discontinuity with the remarkable result that for properly selected $Z_1$ and $Z_2$, the energy is substantially completely transferred into the other circuit. In other words, the matching is substantially perfect, over orders of magnitude in frequency. The mathematical analysis of the matched conditions shows that a limitation on the high-frequency performance in prior art broadband transformers has been removed in the present apparatus.

10 Claims, 2 Drawing Figures

WIDEBAND TRANSFORMER 1

WIDEBAND TRANSFORMER APPARATUS

BACKGROUND OF THE INVENTION

The present invention relates to the field of electronic impedance matching devices, or electrical energy transfer devices. More particularly, the present invention relates to transformer devices utilizing transmission line principles to achieve very wide bandwidths.

In the electronic engineering fields of communications (e.g., mobile radio, cable television), power amplification, antenna matching, microwave circuits, and digital systems, means are frequently required for processing electrical energy spread across a wide band of frequencies without wasting any significant amount of the energy in any frequency range. However, early step-up and step-down transformers for matching impedances of substantially different magnitudes exhibited resonances of stray capacitances and inductances in the apparatus which substantially limited the high-frequency performance.

Later, C. L. Ruthroff in his U.S. Pat. No. 3,037,175 "Broadband Transformers" issued May 29, 1962, (hereby incorporated by reference into the present specification) disclosed an apparatus said to have the broadband characteristics of a parallel wire transmission line and the impedance transformation characteristics of a centertapped autotransformer. Construction and testing of such apparatus is described in an article "Designing Toroidal Transformers to Optimize Wideband Performance" by H. L. Krauss et al., *Electronics*, Aug. b 16, 1973, pages 113-116. The latter authors warn that care in construction is necessary so as to avoid uneven wire spacing that is said to introduce impedance variations that degrade high-frequency performance. Both in theory and in practice such a transformer apparently has limits to its low- and high-frequency performance even when perfectly constructed. Accordingly, it is of interest to the art to find an advantageous alternative transformer apparatus for wideband operation in which the limitations in the prior art can be relaxed or obviated.

SUMMARY OF THE INVENTION

In the present invention, it is recognized that there can be exceptions to the general principle that impedance variations in the windings or lines of a wideband autotransformer or other matching transformer degrade high-frequency performance. In particular, the invention utilizes transmission line means having a first port and a second port with at least one partially reflecting characteristic impedance discontinuity therebetween (for example, due to the use of two different wire spacings or sizes on separate magnetic cores). A circuit with total resistive impedance $R_2$ is connected across the first port. Another circuit is provided having total resistive impedance $R_1$ in series connection with the second port, with the series of the second circuit and the second port being connected across the first port. Remarkably, it is found that when the characteristic impedances along the transmission line are suitably chosen in relation to $R_2$ and $R_1$, electrical energy generated in one of the circuits as an input circuit passes into both ports and is reflected and transmitted at each impedance discontinuity in such a way that substantially all of the energy is delivered to the other circuit.

A mathematical analysis of the high-frequency performance of the invention shows that the high-frequency performance can be considerably extended compared with the prior art because of the introduction of at least one discontinuity. The energy transfer between circuit impedances $R_1$ and $R_2$ in the ratio of 4:1 is capable of being frequency-independent and substantially 100% transfer. Moreover, when the circuit impedances depart from the 4:1 ratio, it is found that the characteristic impedances can be selected to obtain frequency-independent energy transfer, except that the amount transferred is gracefully reduced from 100%. In an additional advantageous feature, slight departures from optimum design are not critical to performance.

The invention is advantageously utilized in the many circuit variations to which prior art autotransformer-like transmission line configurations have already lent themselves, but with the advantageous extended and new performance features provided by the inventive apparatus. Moreover, the present invention by its characteristic features and advantages is expected to permit applications unsuitable to the limitations of prior art devices.

DETAILED DESCRIPTION OF THE DRAWING

Figure 1:
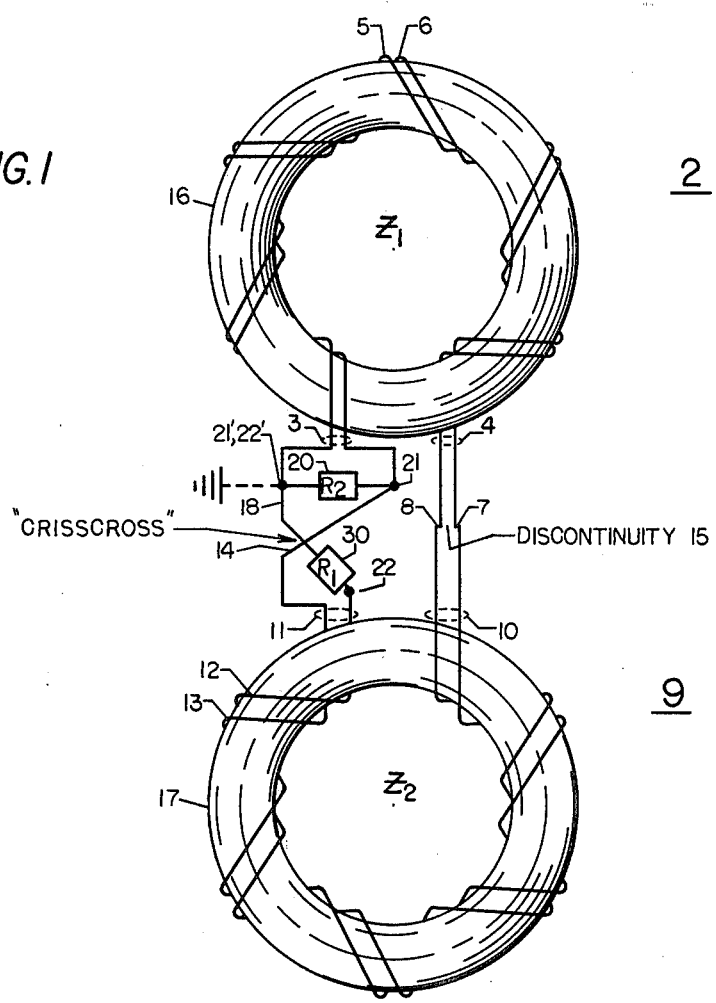
FIG. 1 is a partially pictorial, partially schematic diagram of the preferred embodiment of the wideband transformer apparatus of the present invention.

In FIG. 1 the inventive wideband transformer 1 has first and second transmission line units 2 and 9 joined at characteristic impedance discontinuity 15. The two transmission line units 2 and 9 form a composite transmission line 2,9 having first port 3 and second port 11. An input circuit 20 such as a generator with resistive impedance $R_2$ is connected across port 3. An output circuit 30, such as a load resistor with resistance $R_1$, is connected in series with the second port 11 at point 22. The series circuit of load 30 and second port 11 is connected across first port 3 at points 21 and 21'. Interestingly, in this preferred embodiment 1 the electrical paths 18,30,14 make a crisscross in joining the first port 3 and second port 11.

Input circuit 20 provides electrical energy which flows into port 3, into output circuit 30, and into second port 11. The energy flowing into port 3 passes toward discontinuity 15 along conductive insulated wires 5 and 6, which are helically wound around ferrite toroid 16 of two-element transmission line unit 2. The energy flowing into port 11 passes toward discontinuity 15 along conductive insulated wires 12 and 13 which are helically wound around ferrite toroid 17 of two-element transmission line unit 9.

The propagation times required for energy from circuit 20 to pass from port 3 to discontinuity 15 and from port 11 to discontinuity 15 are made suitably equal in this preferred embodiment 1. This means that the transmission line units 2 and 9 are suitably cut and designed so that the propagation delay lengths are equal. They form a commensurate cascade suitably having a number of transmission line units equal to two. In specific cases in which the velocities of propagation in the units 2 and 9 do not differ, the physical line lengths (measured along the axis of the wires of the lines) are also made equal and discontinuity 15 is provided at the midpoint of the length of the composite transmission line 2,9. Where the velocities of propagation do differ, the line lengths are made such that the discontinuity 15 appears at the propagation delay midpoint.

Since there is only one characteristic impedance discontinuity 15 along the illustrated composite line 2,9 shown in FIG. 1, the line has characteristic impedance $Z_1$ between the port 3 and the discontinuity 15 and the different characteristic impedance $Z_2$ between the discontinuity 15 and the port 11. As a result, when the energy entering ports 3 and 11 impinges on discontinuity 15 from opposite directions, it is partially transmitted and partially reflected at discontinuity 15. The energy passes back toward the ports 3 and 11 and continues to make its way to the output circuit 30 in a complicated process of reflection and transmission, to be analyzed hereinbelow.

Remarkably, this configuration is found to be capable of 100% or near 100% power transfer from source to load. It exhibits a frequency-independent characteristic over an extremely wide bandwidth, when the electrical parameters of the apparatus are suitably chosen.

Figure 2:
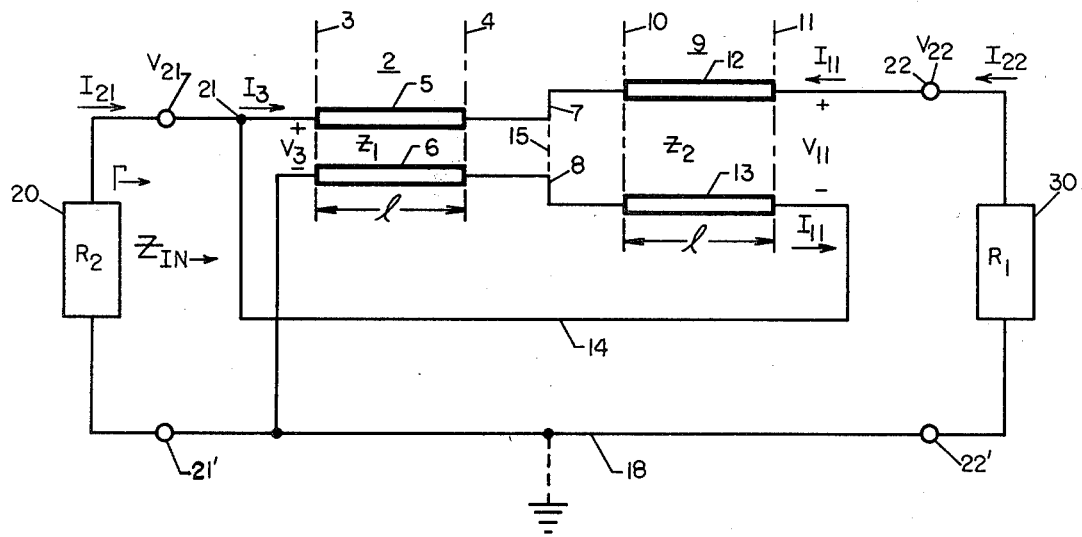
FIG. 2 is a schematic transmission line diagram of the embodiment of FIG. 1.

FIG. 2 shows in schematic transmission line diagram form the wiring of the preferred embodiment of the invention. FIG. 2 is entirely equivalent to the diagram of FIG. 1.

Referring to FIG. 2, transmission line unit 2 has characteristic impedance $Z_1$, and transmission line unit 9 has distinct characteristic impedance $Z_2$. Line units 2 and 9 are coiled around their respective magnetic cores 16 and 17 shown in FIG. 1 but omitted for clarity from FIG. 2. Line 2 is suitably a two-element transmission line composed of electrical conductors 5 and 6 and has first end, or port, 3 and second end, or port, 4. Similarly line 9 is a two-element transmission line composed of electrical conductors 12 and 13 and has first end, or port, 10 and second end, or port, 11. Conductors 5 and 12 are connected with conductor 7 and conductors 6 and 13 are connected with conductor 8, there being a partially reflecting $Z_1$-to-$Z_2$ characteristic impedance discontinuity 15 resulting at this junction. Conductor 13 at the second end 11 of transmission line 9 is electrically connected to conductor 5 at the first end 3 of transmission line 2 by means of conductor 14.

Although conductor 14 occupies considerable length on the diagram of FIG. 2, the physical connection corresponding to conductor 14 as drawn is suitably short compared to a wavelength at the highest frequency of operation. The helical coils of conductors 5,6 and 12, 13 have a substantially constant, or parallel, wire spacing on each toroid 16, 17 and are provided so as to act as transmission lines to improve high-frequency performance. As shown on FIG. 1 the wire spacing on toroid 16 is less than the wire spacing on toroid 17 where appropriate to achieve desired values of characteristic impedance $Z_1$ and $Z_2$. Line 2 has nonnegligible length l from end 3 to end 4 and this line 2 length l is suitably equal to the length of line 9 from end 10 to end 11 so as to have equal phase delays on the lines. A wide-bar drawing technique is used for the conductors 5,6 and 12,13 to indicate that electrical energy propagates along them according to conventional electrical transmission line theory.

Reference is now made to the input and output circuits having the impedances to be matched. One of the circuits 20 has a substantially resistive impedance $R_2$ presented to terminals 21 and 21'. This "$R_2$" circuit 20 is connected directly across the conductors 5,6 at the first end 3 of transmission line 2. Similarly the other circuit 30 presents a substantially resistive impedance $R_1$, where $R_1$ is at least twice $R_2$, to the terminals 22 and 22'. If circuit 20 is the input circuit, or generator, then the apparatus acts as a voltage and impedance step-up transformer. On the other hand, if circuit 30 is the input circuit, or generator, then the apparatus acts as a voltage and impedance step-down transformer.

Circuits 20 and 30 in suitable cases are complex configurations of passive (R,L,C) and active (transistor, other solid state, vacuum tube, etc.) devices which have Thevenin equivalent impedances $R_2$ and $R_1$. Circuits 20 and 30 suitably are or include microwave circuits, digital circuits, transmission line circuits (including cascades of the invention), baluns, waveguides, antennas, and the like. The FIG. 2 circuits 20 and 30 are for simplicity drawn as single-ports, but of course in suitable applications have additional ports not shown in FIG. 2.

Circuit 30 is connected in series with second end 11 of transmission line 9 at terminal 22. The series is connected via conductors 14 and 18 across the first end 3 of line 2 in such manner that conductor 13 at the second end 11 of line 9 is connected to conductor 5 at the first end 3 of line 2. Also, conductor 12 at the second end 11 of line 9 is connected through circuit 30 and conductor 18 to conductor 6 at the first end 3 of line 2. It is seen that ends 3 and 11 are connected through circuit 30 in a "reverse" or "crisscross" manner. By contrast, conductors 5,12 and conductors 6,13 are respectively joined "straight-through" at the second end 4 of line 2 and first end 10 of line 9.

The preferred embodiment 1 is also suitably viewed as a two-core (16,17) autotransformer. The autotransformer 1 has two serially connected coils, each coil consisting of one wire and both coils being wound around both ferrite toroids 16,17 or other suitable magnetic cores. The first coil has a wire consisting of conductor segments 6 and 13. The second coil has a wire consisting of conductor segments 5 and 12. The first coil wire is serially connected at end 11 of conductor segment 13 via conductor 14 to the second coil wire at opposite end 3 of conductor segment 5. Circuit 20 is connected across the first coil at end 11 of wire segment 13 and end 3 of wire segment 6. Circuit 30 is connected across both coils as a serially connected whole at end 11 of conductor segment 12 of the second coil and at end 3 of conductor segment 6 of the first coil. When circuit 20 is a generator the autotransformer 1 acts as a step-up transformer, and when circuit 30 is the generator, the autotransformer acts as a step-down transformer.

The same embodiment of the apparatus can have a variety of different-appearing schematic diagrams depending on where ground is provided. For example, ground can be conventionally taken at terminals 21',22' as shown, or at terminals 21, or 22, or conductor 14, or 7, or 8, or inside circuits 20 or 30. Drawings of the invention with different selections of ground can suggest to the skilled worker additional insights as to the nature, applications, utility, and operation of this preferred embodiment and other embodiments of the invention.

In the preferred embodiment shown, it is contemplated that for frequency-independent operation and low insertion loss there are optimum values of $Z_1$ and $Z_2$. These $Z_1$ and $Z_2$ values are interrelated so that the product of multiplying $Z_1$ by $Z_2$ is substantially equal (within plus or minus five percent ($\pm 5\%$)) to the product of multiplying $R_1$ by $R_2$:

$$Z_1 Z_2 = R_1 R_2 \qquad (1)$$

In the preferred embodiment the following further relations should be substantially satisfied within about plus or minus ten percent (±10%):

$$Z_1 = \sqrt{\frac{2R_1 R_2^2}{R_1 + 2R_2}} \qquad (2)$$

and $$Z_2 = \sqrt{\frac{R_1^2}{2} + R_1 R_2} \qquad (3)$$

When these relations are substantially satisfied, the first circuit 20 is substantially perfectly matched to the second circuit 30 over a wide bandwidth which can be orders of magnitude in frequency.

An important principle of the invention is that whatever circuit configuration is used within the inventive scope, the values of $Z_1, Z_2, R_1, R_2$ are selected so as to result in substantially frequency-independent operation. For the preferred embodiment of FIG. 1 as one such circuit the above formulas (1),(2), and (3) indicate the results of the frequency-independence requirement in relating the characteristic impedances to the input and output circuit resistances presented for matching.

MATHEMATICAL ANALYSIS OF PREFERRED EMBODIMENT

A mathematical analysis of the preferred embodiment of FIGS. 1 and 2 is presented to further suggest the advantageous results to be associated with the invention. It is to be understood, however, that such analysis is not intended as indicating limits of the scope of the invention, since other embodiments within the inventive scope can require separate analyses not here presented.

The present analysis is performed in the frequency domain, although a time domain approach can also be interesting. For convenience, circuit 20 is assumed to be a generator with open circuit r.m.s. voltage V, and circuit 30 is assumed to be a load. The lengths of the transmission line units 2 and 9 are assumed to be electrically equal, that is, they are the same in propagation time required for electrical energy to travel from the first end to the second end of each.

While what follows is primarily a high-frequency analysis, a low-frequency analysis can be applied by considering the device to be an autotransformer having a magnetizing inductance L. The power transfer is reduced from the high-frequency analysis value at all low frequencies for which the reactance of the magnetizing inductance is comparable to or smaller than impedance $R_2$. The use of magnetic core toroids 16 and 17 in the device 1 improves low frequency performance by making magnetizing inductance L high.

It is apparent that since transmission lines 2 and 9 have no dissipative components, the time-average of the sine wave power $P_1$ which enters terminals 21, 21' from circuit 20 and which is not reflected back into circuit 20 must all reach circuit 30 for dissipation in resistance $R_1$. If a perfect match is achieved, the time average load power in circuit 30 equals the maximum available power $P_a$ of the source where $P_a = V^2/(4R_2)$. Thus, an insertion power ratio p can be and is defined as the ratio of $P_1$ to $P_a$, and this ratio cannot exceed 1.0 or 100%.

The approach of the present analysis is to show that the insertion power ratio p can be made *independent of frequency* for the preferred embodiment, while the prior art devices are inherently limited in their high-frequency performance.

To proceed, it can be shown by elementary electrical circuit theory that when the generator impedance is resistive (real) as here, the insertion power ratio p is just unity less the magnitude-squared of the reflection coefficient gamma (Γ) thus:

$$P = 1 - |\Gamma|^2 \qquad (4)$$

The reflection coefficient seen by generator 20 in the preferred embodiment (see FIG. 2) is $$\Gamma = \frac{Z_{IN} - R_2}{Z_{IN} + R_2} \qquad (5)$$

where $Z_{IN}$ is the impedance looking into terminals 21, 21' and is the ratio of voltage $V_{21}$ to current $I_{21}$ (see FIG. 2). To find $Z_{IN}$ note that transmission line units 2 and 9 as a cascade from end 3 to end 11 can be characterized by an ABCD transmission matrix such that $$\begin{bmatrix} V_3 \\ I_3 \end{bmatrix} = \begin{bmatrix} A & B \\ C & D \end{bmatrix} \begin{bmatrix} V_{11} \\ -I_{11} \end{bmatrix} \qquad (6)$$

The input impedance $Z_{IN}$ is obtained by remembering that by Ohm's Law $R_1 = V_{22}/(-I_{22})$ and that the conductor 14 connection relates certain voltages and currents so that $V_{22} = V_{11} + V_3$, $V_{21} = V_3$, $-I_{22} = -I_{11}$, and $I_{21} = I_3 - I_{11}$. Then with some straightforward, albeit tedious, manipulations on equation (6) and using the reciprocity relation $AD - BC = 1$ there results the input impedance $$Z_{IN} = \frac{AR_1 + B}{CR_1 + (A + D + 2)} \qquad (7)$$

Now equation (7) for input impedance is substituted into equation (5) to obtain reflection coefficient in terms of the ABCD parameters. Next substituted equation (5) is substituted into equation (4) to obtain insertion power ratio p in terms of the ABCD parameters of the transmission line configuration and in terms of the input and output circuit resistances $R_1$ and $R_2$. The resulting equation would be useful since it is general in terms of A,B,C, and D and consequently permits mathematical comparisons of different transmission line configurations which can be provided between end 3 and end 11 of FIG. 2.

However, it turns out to be simpler and even more useful to express that resulting substituted equation (4) for insertion power ratio p in terms of a mismatch parameter u defined by the relation $p = 1/(1+u)$ and then solve for u. No information is lost since if p is dependent on or independent of frequency, mismatch u will be similarly dependent on or independent of frequency. Mismatch parameter u is found to be $$u = \frac{[AR_1 - (A + D + 2)R_2]^2 - [B - CR_1R_2]^2}{4R_1R_2[A(A + D + 2) - BC]} \quad (8)$$

This equation (8) for mismatch parameter u is what is used as a testing tool to analyze different transmission line configurations provided between end 3 and end 11 in the context of FIG. 2. If mismatch u is made frequency-independent then the inventive matching apparatus is frequency-independent. If mismatch u is made equal to zero as well, the matching apparatus of the invention provides a perfect match between $R_1$ and $R_2$.

ANALYSIS OF PRIOR ART UNIFORM TRANSMISSION LINE AUTOTRANSFORMER

The ABCD parameters of a uniform transmission line of characteristic impedance $Z_0$ without any impedance discontinuity are here expressed in matrix form, assuming clockwise phasor convention:

$$\begin{bmatrix} A & B \\ C & D \end{bmatrix} = \begin{bmatrix} \cos\theta & -jZ_0\sin\theta \\ \frac{-j\sin\theta}{Z_0} & \cos\theta \end{bmatrix} \quad (9)$$

The variable $\theta$ is the electrical length of the transmission line and this length in radians increases with frequency. Thus, if equation (8) for mismatch u is to be independent of frequency, it must be independent of $\theta$. However, when equation (9) is substituted into equation (8) no combination of $Z_0$, $R_1$, and $R_2$ is found which eliminates the dependence on electrical length $\theta$, much less makes mismatch u be zero for perfect matching in addition.

ANALYSIS OF INVENTIVE EMBODIMENT WITH ONE DISCONTINUITY

The ABCD parameters of two cascaded transmission lines with characteristic impedance $Z_1$ and $Z_2$ respectively are found by simply matrix multiplying the ABCD parameters for each line. The electrical lengths of each line are assumed to be equal and equal to $\theta/2$ for simplicity. Thus $$\begin{bmatrix} A & B \\ C & D \end{bmatrix} = \begin{bmatrix} \cos(\theta/2) & -jZ_1\sin(\theta/2) \\ \frac{-j\sin(\theta/2)}{Z_1} & \cos(\theta/2) \end{bmatrix} \quad (10)$$

$$\begin{bmatrix} \cos(\theta/2) & -jZ_2\sin(\theta/2) \\ \frac{-j\sin(\theta/2)}{Z_2} & \cos(\theta/2) \end{bmatrix}$$

Carrying out the indicated matrix multiplication yields:

$$\begin{bmatrix} A & B \\ C & D \end{bmatrix} = \quad (11)$$

$$\frac{1}{2}\begin{bmatrix} (1 - Z_1/Z_2) + (1 + Z_1/Z_2)\cos\theta & -j(Z_1 + Z_2)\sin\theta \\ -j(\frac{1}{Z_1} + \frac{1}{Z_2})\sin\theta & (1 - Z_2/Z_1) + (1 + Z_2/Z_1)\cos\theta \end{bmatrix}$$

Now the ABCD parameters of the equation (11) for the inventive discontinuous composite transmission line 2,9 in FIG. 2 are substituted into the testing equation (8) for the mismatch parameter u. First of all, notice that when this is done that the second numerator term $(B - CR_1R_2)^2$ is made to vanish when the product of the characteristic impedances $Z_1$ and $Z_2$ is equal to the product of the circuit resistances $R_1$ and $R_2$ (Equation (1)). Since there is otherwise a dependence on electrical length $\theta$ in that second numerator term, it is necessary to make the term vanish to start toward the goal of frequency-independence.

With said second term in equation (8) set to zero, and using the here-defined dimensionless ratios $m = R_1/R_2$ and $z = Z_1/Z_2$, the mismatch parameter u can be additionally simplified after considerable tedious manipulation to yield:

$$u = \frac{1}{4m}\left[\frac{[m(1-z) - 6 + z + 1/z] + [m(1+z) - (2 + z + 1/z)]\cos\theta}{(3-z) + (1+z)\cos\theta}\right]^2 \quad (12)$$

The only way that mismatch parameter u in equation (12) can be a constant independent of frequency, or electrical length $\theta$ eliminated, is for the ratio of the coefficients of $\cos\theta$ in the numerator and denominator to be equal to the ratio of the left-bracket constant expressions in the numerator and denominator. When the just-mentioned frequency-independence condition is written out and simplified the result is simply $$Z_1/Z_2 = \frac{2}{2 + R_1/R_2} \quad (13)$$

Combining equation (13) as a second frequency-independence requirement with the previously-stated frequency-independence requirement $$Z_1Z_2 = R_1R_2 \quad (1)$$

yields the above-stated equations (2) and (3):

$$Z_1 = \sqrt{\frac{2R_1R_2^2}{R_1 + 2R_2}} \quad (2)$$

and $$Z_2 = \sqrt{\frac{R_1^2}{2} + R_1R_2} \quad (3)$$

In other words, for given circuit resistances $R_1$ and $R_2$, the inventive embodiment of FIGS. 1 and 2 can offer frequency-independent matching when the transmission line 2 and 9 characteristic impedances are as given by equations (2) and (3). In this way a plurality of transmission line units connected in the manner of the invention synergistically cooperate to achieve a frequency-independence result not available with any choice of characteristic impedance of one unit alone nor available to prior art autotransformer matching devices.

Interestingly, when $R_1 = 4R_2$ (invention being used as a 2:1 voltage transformer or 4:1 impedance transformer), the power transfer is a perfect unity and the mismatch is zero and frequency-independent (p=1, u=0) when $Z_1 = R_1/(2\sqrt{3})$ and $Z_2 = R_1\sqrt{3}/2$. These two characteristic impedance values are easily found by substitution of $R_1 = 4R_2$ in equations (2) and (3).

For resistance combinations other than the 4:1 ratio, the optimum $Z_1$ and $Z_2$ are still as given in equations (2)

and (3). Also, the insertion power ratio is still frequency-independent, but instead of being unity, is given in general by $$p_o = \frac{16m}{(m+4)^2}. \quad (14)$$

A little calculation readily shows that if the power transfer result from equation (14) is compared with the power transfer $4m/(m+1)^2$ by direct connection to $R_1$ from the generator $R_2$, the inventive embodiment has a power transfer, or matching, advantage for all $R_1$ greater than twice $R_2$, $(m>2)$.

MANUFACTURING TOLERANCE ANALYSIS

In the course of practice of the invention by those skilled in the art, it is to be expected that actual devices will be subject to variations in manufacture. Thus, in practice the transmission line impedances $Z_1$ and $Z_2$ will unavoidably depart somewhat from the precise relationships to the resistances $R_1$ and $R_2$ stated by equations (1), (2), and (3) for which the transfer characteristic is frequency-independent or "flat". Accordingly, it is contemplated that the person skilled in the art will, when necessary, specify manufacturing tolerances resulting from performance requirements on the device. In some applications the performance requirements may include requiring power to the load to stay within plus or minus a given percentage of the ideal value of equation (14) up to a given top frequency. In other applications there may be a requirement that power to the load be no lower than a given percentage of the ideal value of equation (14) up to a given top frequency.

To solve these and other design problems, the general relationship for mismatch parameter u is obtained by substituting equation (11) for the ABCD parameters into equation (8) for u with result $$u = \frac{1}{4m} \left[ \frac{[m(1-z) - 6 + z + 1/z] + [m(1+z) - (2+z+1/z)]\cos\theta}{(3-z) + (1+z)\cos\theta} \right]^2 + \frac{(2+z+1/z)}{4} \left[ \frac{(n - 1/n)\sin\theta}{(3-z) + (1+z)\cos\theta} \right]^2 \quad (15)$$

where $m = R_1/R_2$; $z = Z_1/Z_2$; and $n = \sqrt{R_1R_2/Z_1Z_2}$.

Inspection of equation (15) for u shows that mismatch parameter u is periodic in electrical length $\theta$ because u is a function of periodic functions sine and cosine in equation (15). The skilled worker can analyze equation (15) (using the calculus, numerical methods, or otherwise) for its maxima and minima for given values of m, n, and z. In this way it is possible to determine the permissible departures of m, n, and z from the ideal values given by equations (1), (2), and (3) which will still meet the performance requirements at hand.

The present inventor's work indicates that performance of the invention is, in general, gracefully degraded as its physical realization departs from the ideal values or conditions (1), (2), and (3). However, in some cases the average insertion power ratio p can be increased above its "flat" value, but at the expense of introducing a ripple-shaped curve as a function of electrical length $\theta$. On the whole, it is considered good practice of the invention in its preferred embodiment of FIGS. 1 and 2 to satisfy equation (1) within plus or minus five percent ($\pm 5\%$) and characteristic impedance equations (2) and (3) within about plus or minus ten percent ($\pm 10\%$). Likewise, it is good practice to satisfy the second frequency-independence condition, equation (13) within about plus or minus five percent ($\pm 5\%$).

In some applications of the invention practical considerations may force a use of values of m, n, and z in equation (15) that result in calculated maxima and minima in the mismatch parameter u that lie outside of design requirements. An approach to solving this special subset of problems is to keep the total electrical length $\theta$ shorter than a half wavelength at the highest frequency f of operation. Then the exact physical length l of each transmission line unit is chosen to satisfy the design requirement or limit on mismatch parameter u at the highest frequency f of operation by the equation $$l = \left(\frac{v}{2\pi f}\right)\frac{\theta}{2} \quad (16)$$

where v is the phase velocity of the transmission line unit.

EXAMPLE

In an embodiment of the invention according to FIGS. 1 and 2, $m=9$ and $n=1$. z is to be permitted to depart from its ideal value of 2/11 (from equation (13)) to as much as 2/10. If the performance requirement is that power to the load is to stay within $\pm 5\%$ up to a frequency of 1.0 GHz., and phase velocity will be $v = 1.5 \times 10^8$ meters/second, then numerical or graphical analysis on equation (15) (or equation (12) since $n=1$) finds a maximum electrical length $\theta$ of 2.2 radians. Substituting the values of v, f, and $\theta$ into length equation (16) yields a maximum coil wire length l for each line unit 2 or 9 of 2.63 centimeters. It should be understood, however, that if z can be more tightly constrained or if the tolerable variation in power to the load can be sufficiently increased then there is no constraint on wire length l introduced by the analysis.

In all cases it is understood that the above-described arrangements are simply illustrative of a small number of the many possible specific embodiments which can represent applications of the principles of the invention. Numerous and varied other arrangements can readily be devised in accordance with these principles by those skilled in the art without departing from the spirit and scope of the invention and so that the utility of the invention can be fully realized.

I claim:

1. Electrical energy transfer apparatus comprising transmission line means having a first port and a second port, said transmission line means comprising a plurality of transmission lines respectively having different characteristic impedances, said transmission lines being connected together so that there is at least one partially reflecting characteristic impedance discontinuity formed by said transmission lines being connected together, each said discontinuity being located in said transmission line means between said first port and said second port; and input circuit means and output circuit means, one of said circuit means having a total resistive impedance $R_2$ and being connected across said first port, the other said circuit means having total resistive impedance $R_1$ in series connection with said second port, with said series being connected across said first port, said apparatus having values of $R_1$ and $R_2$ and of said characteristic impedances such that electrical energy from said input circuit passes into both said first and second ports and is reflected and transmitted at each said discontinuity in said transmission line means so that substantially all of said energy is delivered only to said output circuit.

2. Electrical energy transfer apparatus as claimed in claim 1 wherein said transmission line means has a propagation delay midpoint, said characteristic impedance discontinuity is located at said midpoint and there is only one said characteristic impedance discontinuity along said transmission line means so that said transmission line means has a characteristic impedance $Z_1$ between said first port and said midpoint and a different characteristic impedance $Z_2$ between said midpoint and said second port.

3. Electrical energy transfer apparatus as claimed in claim 2 wherein $R_1$ exceeds twice $R_2$ and $Z_1$ is within ten percent (10%) of being the same as $$\sqrt{\frac{2R_1R_2^2}{R_1 + 2R_2}}$$

and $Z_2$ is within ten percent (10%) of being the same as $$\sqrt{\frac{R_1^2}{2} + R_1R_2}.$$

4. Electrical transformation apparatus comprising first and second transmission line means, said first and second transmission line means each having first and second ends and said first and second transmission line means each having first and second electrical conductors, said first and second transmission line means having substantially equal lengths from end to end but distinct characteristic impedance $Z_1$ for said first transmission line means and $Z_2$ for said second transmission line means, the first and second conductors at said second end of said first transmission line means being respectively connected to the first and second conductors at said first end of said second transmission line means so as to result in a characteristic impedance discontinuity;

first electrical circuit means coupled to said first and second conductors at said first end of said first transmission line means, said first circuit presenting a total substantially resistive impedance $R_2$; and second electrical circuit means coupled in series with said second end of said second transmission line means, said second circuit and said second end of said second transmission line means together being so connected to said first end of said first transmission line means that the first conductor at said first end of said first transmission line means is electrically connected to the second conductor at said second end of said second transmission line means and that the second conductor at said first end of said first transmission line means is electrically connected to the first conductor at said second end of said second transmission line means, the total impedance $R_1$ of said second circuit means being substantially resistive and exceeding twice $R_2$;

said characteristic impedance $Z_1$ being within ten percent (10%) of being equal to $$\sqrt{\frac{2R_1R_2^2}{R_1 + 2R_2}},$$

said characteristic impedance $Z_2$ being within ten percent (10%) of being equal to $$\sqrt{\frac{R_1^2}{2} + R_1R_2},$$

whereby said first circuit is substantially perfectly matched to said second circuit over a wide bandwidth.

5. Electrical transformation apparatus as claimed in claim 4 wherein said first and second transmission line means are respectively coiled around first and second magnetic core means.

6. Electrical transformation apparatus as claimed in claim 4 wherein said first and second transmission line means are substantially the same in propagation time required for electrical energy to travel from the first end to the second end of each.

7. Electrical transformation apparatus comprising first and second transmission line means, said first and second transmission line means each having first and second ends and said first and second transmission line means each having first and second electrical conductors, said first and second transmission line means having substantially equal phase delays from end to end but distinct characteristic impedance $Z_1$ for said first transmission line means and $Z_2$ for said second transmission line means, the first and second conductors at said second end of said first transmission line means being respectively connected to the first and second conductors at said first end of said second transmission line means so as to result in a partially reflecting characteristic impedance discontinuity, the first conductor at said first end of said first transmission line means being connected to the second conductor at said second end of said second transmission line means, said first and second transmission line means being coiled around first and second magnetic cores respectively;

first electrical circuit means coupled to said first and second conductors at said first end of said first transmission line means, said first circuit presenting a resistive impedance $R_2$; and second electrical circuit means coupled to said first conductor at said second end of said second transmission line means and said second conductor at said first end of said first transmission line means and presenting a resistive impedance $R_1$, $R_1$ exceeding twice $R_2$, said characteristic impedance $Z_1$ being within ten percent (10%) of being equal to $$\sqrt{\frac{2R_1R_2{}^2}{R_1+2R_2}},$$

said characteristic impedance $Z_2$ being within ten percent (10%) of being equal to $$\sqrt{\frac{R_1{}^2}{2}+R_1R_2}$$

whereby said first electrical circuit is substantially perfectly matched to said second electrical circuit.

8. In combination, first and second transmission lines each said line having characteristic impedance $Z_1$ and $Z_2$ respectively, and each said line comprising a pair of conductive insulated wires wound together in a substantially helical form, said wires in each said pair having a constant spacing from a first end of each to the second end of each, said pair of wires at said second end of said first line being respectively connected to said pair of wires at said first end of said second line thereby to form a pair of coils having one and only one $Z_1$-to-$Z_2$ impedance discontinuity therein located midway along the length of said coils;

said coils being serially connected so that the wire of one coil at said second end of said second line is connected to the wire of the other coil at said first end of said first line; and an input circuit and an output circuit, one of said circuits having an impedance $R_1$ connected across both of said serially connected coils and the other of said circuits having an impedance $R_2$ connected across one of said coils wherein the characteristic impedances $Z_1$ and $Z_2$ and said circuit impedances are substantially related by $$Z_1=\sqrt{\frac{2R_1R_2{}^2}{R_1+2R_2}}$$

and $$Z_2=\sqrt{\frac{R_1{}^2}{2}+R_1R_2}.$$

9. Wideband transformer apparatus comprising a transmission line having a first end and a second end comprising a pair of conductive insulated wires wound together and coiled so as to form a pair of coils, said wires of said line being serially connected with the first end of one being connected to the second end of the other, an input circuit and an output circuit, one of said circuits having a resistive impedance $R_1$ connected across both of said serially connected wires, and the other of said circuits having a resistive impedance $R_2$ connected across one of said wires and across said first end of said line CHARACTERIZED IN THAT said transmission line has a propagation delay midpoint and has exactly one characteristic impedance discontinuity, said discontinuity being located at said midpoint, said characteristic impedance being $Z_1$ between said midpoint and said first end and being $Z_2$ between said midpoint and said second end wherein the product of $Z_1$ and $Z_2$ is within 5% of being equal to the product of $R_1$ and $R_2$, and $Z_1$ is within 10% of being equal to $$\sqrt{\frac{2R_1R_2{}^2}{R_1+2R_2}}.$$

10. Wideband transformer apparatus as claimed in claim 9 wherein $R_1$ exceeds twice $R_2$ and said coils on either side of said midpoint are wound around separate magnetic core means.

* * * * *